United States Patent
Ito et al.

(10) Patent No.: US 8,390,063 B2
(45) Date of Patent: Mar. 5, 2013

(54) SEMICONDUCTOR DEVICE HAVING A LIGHTLY DOPED SEMICONDUCTOR GATE AND METHOD FOR FABRICATING SAME

(75) Inventors: Akira Ito, Irvine, CA (US); Xiangdong Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 302 days.

(21) Appl. No.: 12/657,901

(22) Filed: Jan. 29, 2010

(65) Prior Publication Data
US 2011/0186926 A1 Aug. 4, 2011

(51) Int. Cl.
*H01L 29/66* (2006.01)
(52) U.S. Cl. ........ 257/335; 257/339; 257/345; 257/404; 257/E21.435; 438/217; 438/282
(58) Field of Classification Search .................. None
See application file for complete search history.

(56) References Cited

U.S. PATENT DOCUMENTS

| | | | |
|---|---|---|---|
| 6,300,201 B1* | 10/2001 | Shao et al. | 438/281 |
| 2002/0003255 A1* | 1/2002 | Usuki et al. | 257/316 |
| 2004/0075150 A1* | 4/2004 | Juengling et al. | 257/388 |
| 2006/0223248 A1* | 10/2006 | Venugopal et al. | 438/197 |
| 2009/0090983 A1* | 4/2009 | Adkisson et al. | 257/409 |

* cited by examiner

*Primary Examiner* — Tan N Tran
*Assistant Examiner* — Scott R Wilson
(74) *Attorney, Agent, or Firm* — Farjami & Farjami LLP

(57) ABSTRACT

According to one embodiment, a semiconductor device comprises a high-k gate dielectric overlying a well region having a first conductivity type formed in a semiconductor body, and a semiconductor gate formed on the high-k gate dielectric. The semiconductor gate is lightly doped so as to have a second conductivity type opposite the first conductivity type. The disclosed semiconductor device, which may be an NMOS or PMOS device, can further comprise an isolation region formed in the semiconductor body between the semiconductor gate and a drain of the second conductivity type, and a drain extension well of the second conductivity type surrounding the isolation region in the semiconductor body. In one embodiment, the disclosed semiconductor device is fabricated as part of an integrated circuit including one or more CMOS logic devices.

20 Claims, 6 Drawing Sheets

SEMICONDUCTOR DEVICE HAVING A LIGHTLY DOPED SEMICONDUCTOR GATE AND METHOD FOR FABRICATING SAME

BACKGROUND OF THE INVENTION

1. Field of the Invention

The present invention is generally in the field of semiconductors. More specifically, the present invention is in the field of fabrication of semiconductor devices.

2. Background Art

Due to its numerous advantages, such as high density, low power consumption, and relative noise immunity, for example, complementary metal-oxide-semiconductor (CMOS) technology is widely used in integrated circuits (ICs) to provide control logic and to mediate input/output (IO) for modern electronic systems. As advancements in process technologies have resulted in core and IO devices being scaled down, the operating voltages of those devices have been correspondingly reduced. Consequently, the design of circuits to interface higher voltage operating devices with circuits containing core and IO devices has become increasingly challenging.

The conventional design techniques for interfacing IO circuits with higher voltage devices used in earlier technology regimes, such as stacking devices, level translation, and the like, are proving to be inadequate in the face of continued reductions in core and IO operating voltages. Alternatives to the use of conventional interfacing techniques include separate design of some of the IO circuits using a high voltage process, or the use of additional processing and masking steps to accommodate interface with higher voltage devices. Unfortunately, neither alternative is desirable because both approaches render integration of high voltage devices with standard CMOS processing inefficient and costly.

Thus, there is a need to overcome the drawbacks and deficiencies in the art by delivering a solution compatible with existing CMOS fabrication process flows, which enables concurrent fabrication of high voltage devices.

SUMMARY OF THE INVENTION

A semiconductor device having a lightly doped semiconductor gate and method for fabricating same, substantially as shown in and/or described in connection with at least one of the figures, as set forth more completely in the claims.

DETAILED DESCRIPTION OF THE INVENTION

Figure 1:
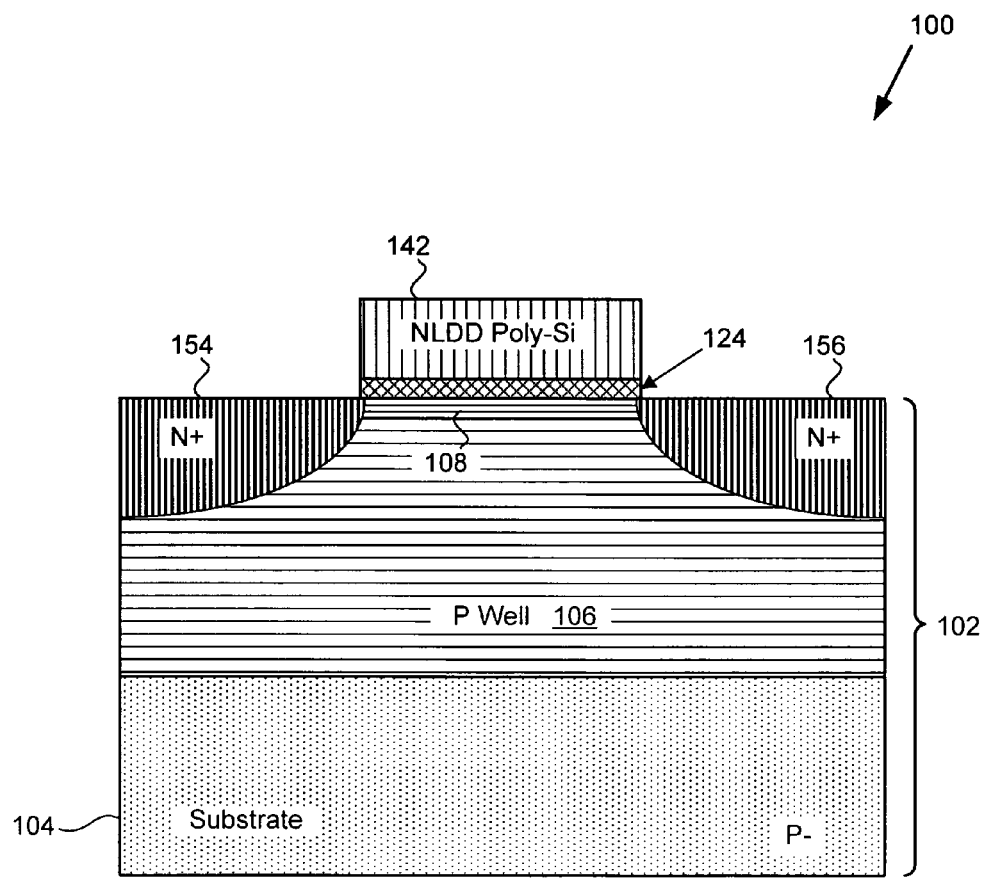
FIG. 1 shows a cross-sectional view of a structure representing a metal-oxide-semiconductor field-effect transistor (MOSFET) including a lightly doped semiconductor gate, according to one embodiment of the present invention.

The present invention is directed to a semiconductor device having a lightly doped semiconductor gate and method for its fabrication. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention, which use the principles of the present invention, are not specifically described in the present application and are not specifically illustrated by the present drawings. It should be borne in mind that, unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a cross-sectional view of a structure representing a metal-oxide-semiconductor field-effect transistor (MOSFET) including a lightly doped semiconductor gate, according to one embodiment of the present invention. MOSFET 100, in FIG. 1, may be configured for use as a high voltage device, for example, due to an increased resistance to voltage breakdown flowing from depletion of its lightly doped semiconductor gate. Moreover, because fabrication of MOSFET 100 can be performed using processing steps presently included in many complementary metal-oxide-semiconductor (CMOS) foundry process flows, such as a high-k metal gate CMOS process flow, for example, MOSFET 100 may be fabricated alongside conventional CMOS devices, and may be monolithically integrated with CMOS logic, for example, in an integrated circuit (IC) fabricated on a semiconductor wafer or die.

It is noted that the specific features represented in FIG. 1 are provided as part of an example implementation of the present inventive principles, and are shown with such specificity as an aid to conceptual clarity. Because of the emphasis on conceptual clarity, it should be understood that the structures and features depicted in FIG. 2 may not be drawn to scale. Furthermore, it is noted that particular details such as the type of semiconductor device represented by MOSFET 100, its overall layout, its channel conductivity type, and the particular dimensions attributed to its features are merely being provided as examples, and should not be interpreted as limitations.

For example, although the embodiment shown in FIG. 1 characterizes MOSFET 100 as an n-channel device, more generally, a semiconductor device according to the present inventive principles can comprise an n-channel or p-channel MOSFET. Furthermore, in some embodiments, the principles disclosed herein can be implemented to fabricate one or more variations on the arrangement shown in FIG. 1, such as through implementation as a lateral diffused metal-oxide-semiconductor (LDMOS) device, for example.

As shown in FIG. 1, according to one embodiment of the present invention, a semiconductor device having a lightly doped semiconductor gate may correspond to MOSFET 100. MOSFET 100, which is represented as an NMOS device, can be fabricated in P type semiconductor body 102, which may comprise a portion of a silicon wafer or die, for example. Semiconductor body 102 includes P type substrate 104, P well region 106, and P type channel implant 108. MOSFET 100 comprises semiconductor gate 142 formed on high-k gate dielectric 124, which is formed over channel implant 108 and P well region 106. As further shown in FIG. 1, gate 142, which may comprise polysilicon, has been lightly doped to have N type conductivity, such as through a lightly doped drain (LDD) implantation step performed in the course of a CMOS process flow, for example.

Figure 2:
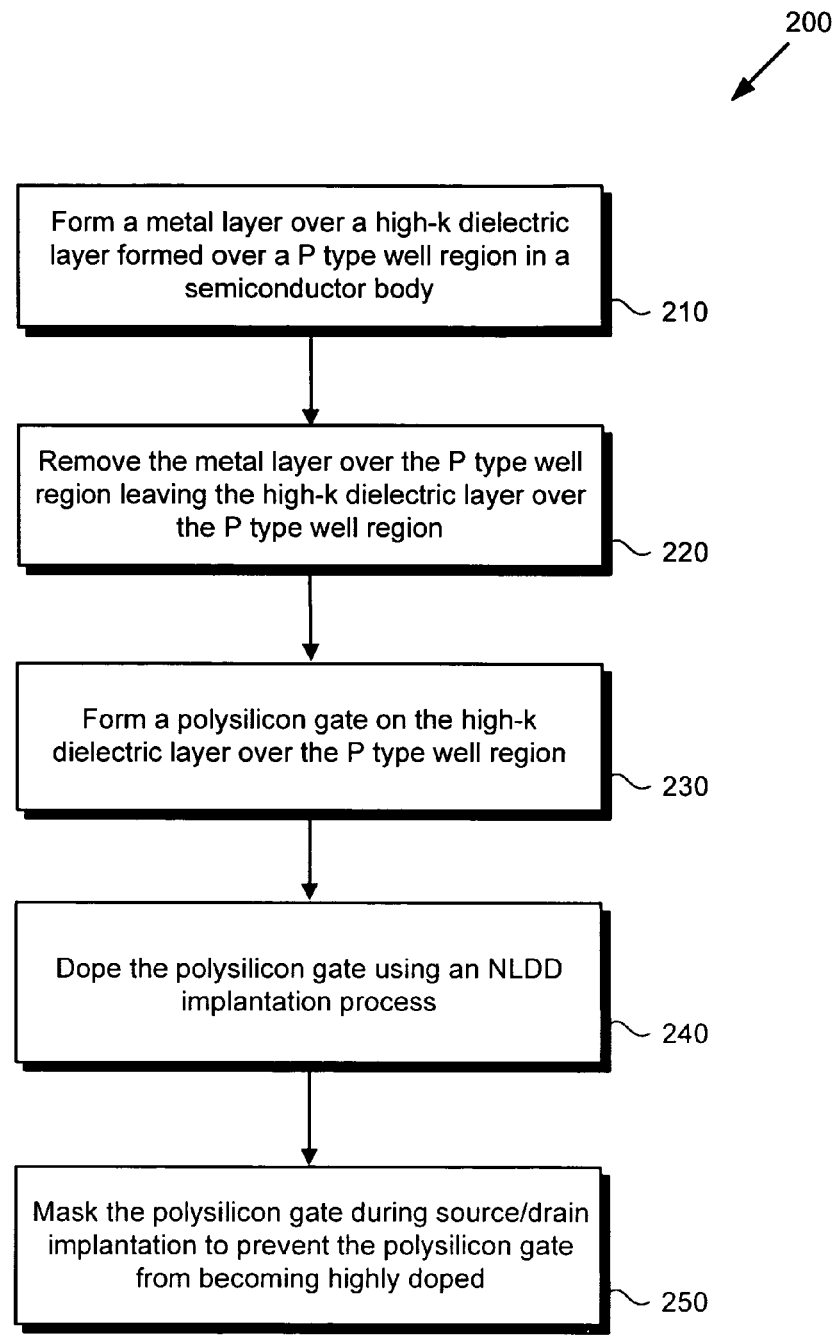
FIG. 2 is a flowchart presenting a method for fabricating a semiconductor device having a lightly doped semiconductor gate, according to one embodiment of the present invention.

Some of the features and advantages of a semiconductor device having a lightly doped semiconductor gate will be further described in combination with FIGS. 2 and 3A through 3E. FIG. 2 shows flowchart 200 presenting a method for fabricating a semiconductor device having a lightly doped semiconductor gate, according to one embodiment of the present invention. Certain details and features have been left out of flowchart 200 that are apparent to a person of ordinary skill in the art. For example, a step may comprise one or more substeps or may involve specialized equipment or materials, as known in the art. While steps 210 through 250 indicated in flowchart 200 are sufficient to describe one embodiment of the present invention, other embodiments of the present invention may utilize steps different from those shown in flowchart 200, or may comprise more, or fewer, steps.

It is noted that the processing steps shown in flowchart 200 are performed on a portion of a processed wafer, which, prior to step 210, may include, among other things, a substrate, such as a P type substrate 104, in FIG. 1, a doped well region, such as P well region 106, in FIG. 1, and a channel implant, such as channel implant 108, in FIG. 1. Structures 310 through 350, shown respectively in FIGS. 3A through 3E, illustrate the result of performing respective steps 210 through 250 of flowchart 200. For example, structure 310 shows a semiconductor structure after processing step 210, structure 320 shows structure 310 after the processing of step 220, structure 330 shows structure 320 after the processing of step 230, and so forth.

Figure 3A:
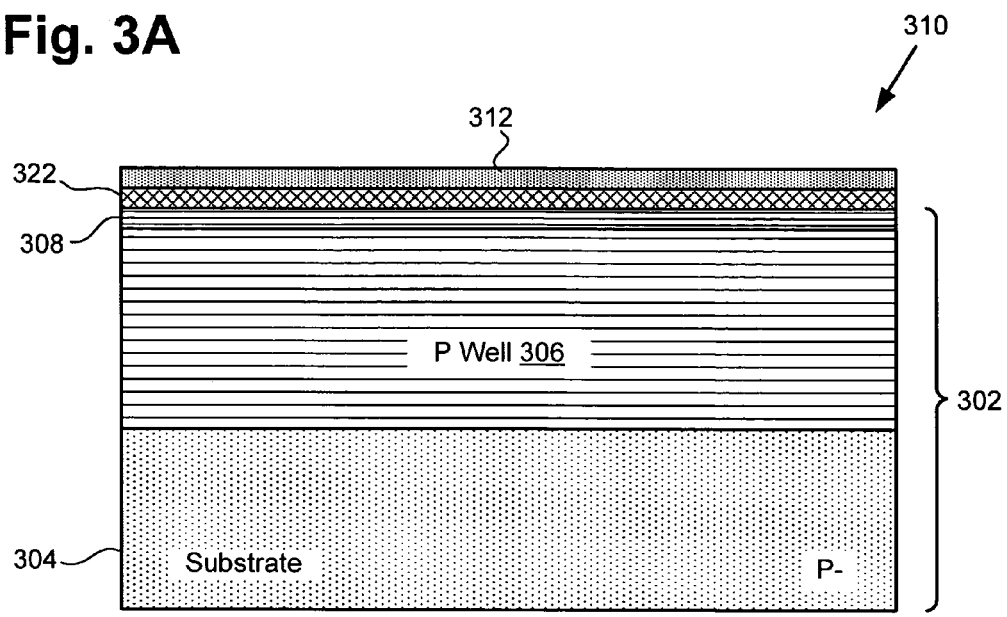
FIG. 3A shows a cross-sectional view, which includes a portion of a wafer fabricated according to an embodiment of the present invention, corresponding to an initial step in the flowchart in FIG. 2.

Referring now to FIG. 3A, structure 310 of FIG. 3A shows a structure including semiconductor body 302, after completion of step 210 of flowchart 200 in FIG. 2. In structure 310, semiconductor body 302 includes substrate 304, which can be a P type silicon substrate, P well region 306, and P type channel implant 308. Semiconductor body 302 including substrate 304, P well region 306, and P type channel implant 308 corresponds to semiconductor body 102 including substrate 104, P well region 106, and P type channel implant 108, in FIG. 1. Furthermore, it is noted that although FIG. 3A shows an initial step of flowchart 200, in FIG. 2, as applied during fabrication of an NMOS device, in other embodiments, the method of flowchart 200 can be suitably modified for fabrication of a PMOS device. In those embodiments, for example, semiconductor body 302 could include an N well region, either formed in P well region 306 or formed in place of P well region 306, and an N type channel implant in place of P type channel implant 308.

Continuing to refer to step 210 in FIG. 2 and structure 310 in FIG. 3A, at step 210 of flowchart 200, metal layer 312 is formed over high-k dielectric layer 322. As shown in FIG. 3A, high-k dielectric layer 322 is situated over P type channel implant 308 and P well region 306 in semiconductor body 302. High-k dielectric layer 322 can be, for example, a high-k gate dielectric layer (e.g. a high-k dielectric layer that can be utilized for forming an NMOS or PMOS gate dielectric), such as high-k gate dielectric 124 in FIG. 1. High-k dielectric layer 322 can comprise, for example, a metal oxide such as hafnium oxide ($HfO_2$), zirconium oxide ($ZrO_2$), or the like. High-k dielectric layer 322 can be formed, for example, by depositing a high-k dielectric material, such as hafnium oxide or zirconium oxide, over semiconductor body 302 by utilizing a physical vapor deposition (PVD) process, a chemical vapor deposition (CVD) process, or other suitable deposition process.

Also shown in FIG. 3A, metal layer 312 can comprise a gate metal used in a typical CMOS process flow, such as a gate metal for an NMOS or PMOS device gate. In embodiments of the invention in which a semiconductor device having a lightly doped semiconductor gate is fabricated using NMOS process steps, for example, metal layer 312 can comprise tantalum (Ta), tantalum nitride (TaN), titanium nitride (TiN), or other gate metal suitable for utilization in an NMOS device gate. Metal layer 312 can be formed, for example, by depositing a layer of tantalum, tantalum nitride, or titanium nitride over high-k dielectric layer 322 by utilizing a PVD process, a CVD process, or other deposition process. The result of step 210 of flowchart 200 is illustrated by structure 310 in FIG. 3A.

Figure 3B:
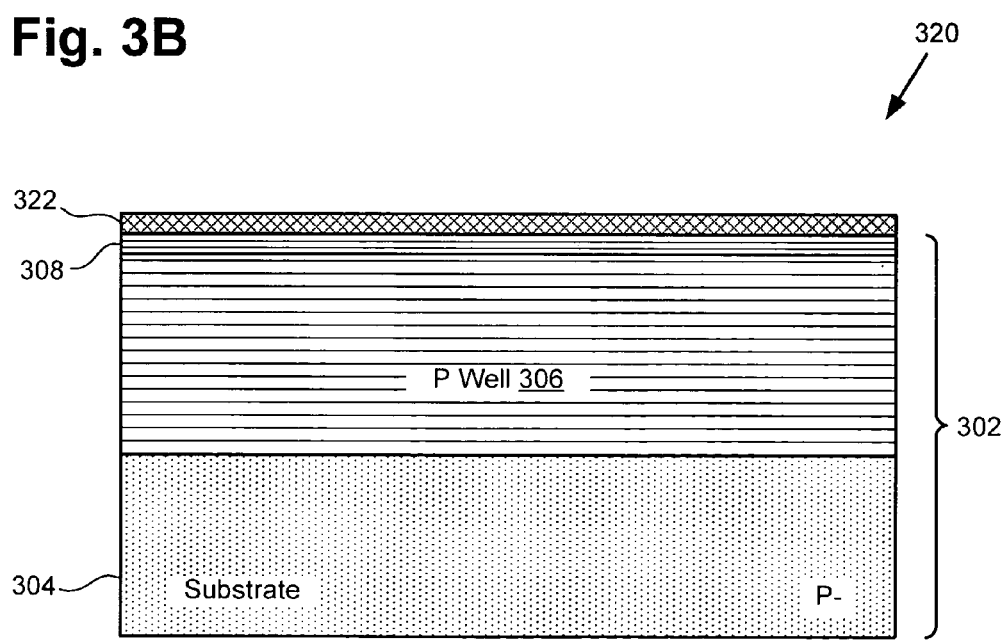
FIG. 3B shows a cross-sectional view, which includes a portion of a wafer fabricated according to an embodiment of the present invention, corresponding to an intermediate step in the flowchart in FIG. 2.

Moving on to step 220 in FIG. 2 and structure 320 in FIG. 3B, at step 220 of flowchart 200, metal layer 312 is removed over P well region 306, leaving high-k dielectric layer 322 over P well region 306 and P type channel implant 308. During the metal layer removal process, which can include a masking step and an etch step, metal layer 322 can be removed from over P well region 306 while being retained over other portions of semiconductor body 302 in which high-k metal gate CMOS devices are concurrently being fabricated (high-k metal gate CMOS devices not shown in FIGS. 3A through 3E).

Although not explicitly shown in the embodiment of previous FIG. 3A, structure 310 may further include a dielectric capping layer formed between high-k dielectric layer 322 and metal layer 312. Such a capping layer may comprise lanthanum oxide ($La_2O_3$), magnesium oxide (MgO), or barium oxide (BaO), for example. In those embodiments in which a dielectric capping layer has been formed between high-k dielectric layer 322 and metal layer 312, removal of metal layer 312, in step 220, includes removal of the dielectric capping layer so as to expose high-k dielectric layer 322. The result of step 220 of flowchart 200 is illustrated by structure 320 in FIG. 3B.

Figure 3C:
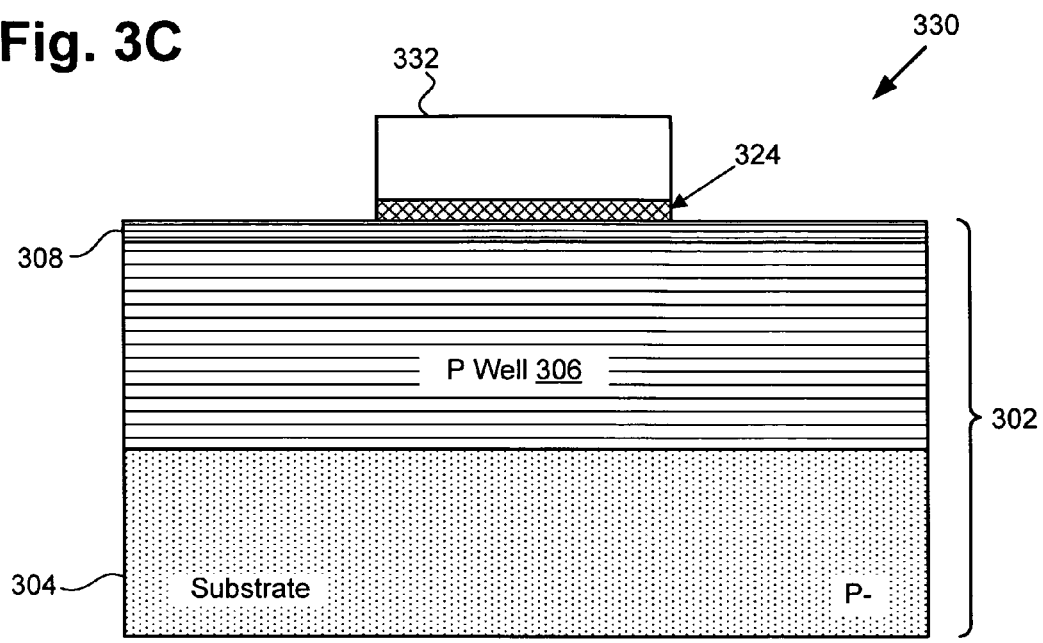
FIG. 3C shows a cross-sectional view, which includes a portion of a wafer fabricated according to an embodiment of the present invention, corresponding to an intermediate step in the flowchart in FIG. 2.

Continuing with step 230 of flowchart 200 and referring to structure 330 in FIG. 3C, at step 230 of flowchart 200, polysilicon gate 332 is formed on high-k gate dielectric 324, over P well region 306. Polysilicon gate 332 can be formed, for example, by depositing a layer of polysilicon on high-k dielectric layer 322 utilizing a low pressure chemical vapor deposition (LPCVD) process or other suitable deposition process, and then masking and patterning those layers to produce polysilicon gate 332 on high-k gate dielectric 324. Moreover, in so far as typical CMOS fabrication steps include formation of a polysilicon layer over a metal layer, such as metal layer 312 in FIG. 3A, as part of forming a high-k and metal CMOS gate stack, the polysilicon deposition and patterning used to form polysilicon gate 322 may be accomplished using known CMOS process flow. It is noted that although gate 322 is characterized as comprising polysilicon for compatibility with typical CMOS fabrication materials, more generally, gate 322 may comprise any suitable semiconductor material. The result of step 230 of flowchart 200 is illustrated by structure 330 in FIG. 3C.

Figure 3D:
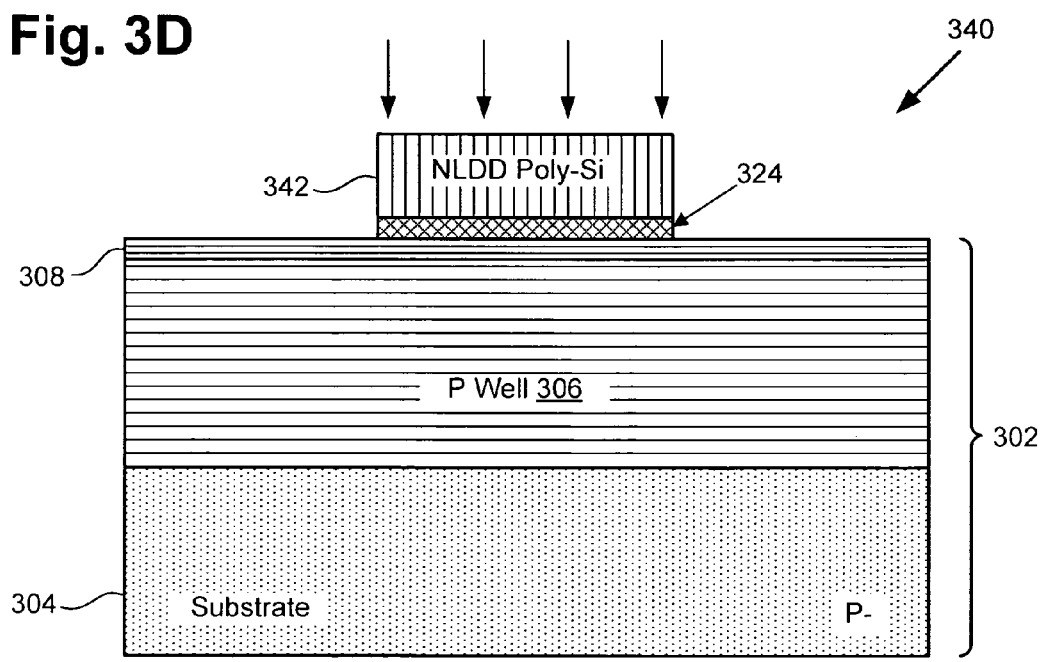
FIG. 3D shows a cross-sectional view, which includes a portion of a wafer fabricated according to an embodiment of the present invention, corresponding to an intermediate step in the flowchart in FIG. 2.

Moving now to step 240 of flowchart 200 and referring to structure 340 in FIG. 3D, step 240 comprises doping polysilicon gate 332 using an N type lightly doped drain (NLDD) implantation process to produce lightly doped polysilicon gate 342. Drain extension techniques utilizing NLDD or PLDD implantation are commonly used in CMOS fabrication process flows to, for example, enhance the drain breakdown voltage and minimize hot electron device instability in NMOS and PMOS devices, respectively. As a result, step 240 of flowchart 200 is compatible with existing CMOS process flows, and can be performed without adding additional process steps. The result of step 240 of flowchart 200 is illustrated by structure 340 in FIG. 3D.

Figure 3E:
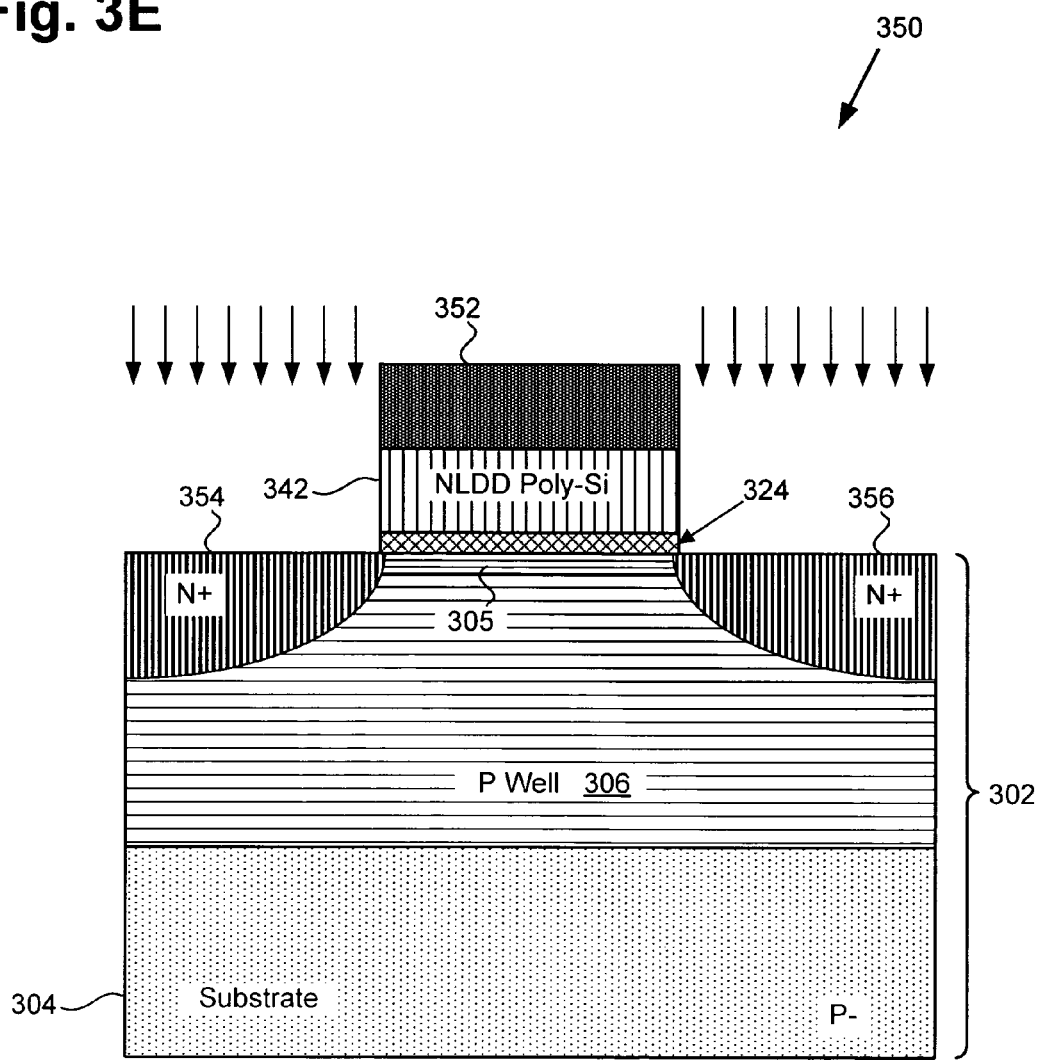
FIG. 3E shows a cross-sectional view, which includes a portion of a wafer fabricated according to an embodiment of the present invention, corresponding to a final step in the flowchart in FIG. 2.

Continuing with step 250 of FIG. 2 and referring to structure 350 in FIG. 3E, step 250 of flowchart 200 comprises masking lightly doped polysilicon gate 342 during source/drain implantation to prevent lightly doped polysilicon gate 342 from becoming highly doped. Masking of lightly doped polysilicon gate 342 can be achieved as part of existing masking procedures used to protect selected portions of a semiconductor wafer or die during source/drain implantation performed in the course of standard CMOS processing. The result of step 250 of flowchart 200 is illustrated by structure 350 in FIG. 3E.

In conventional high-k process technologies, a gate stack combination of a dielectric cap formed over a high-k gate dielectric, a metal gate formed over the dielectric cap, and a highly doped polysilicon layer formed over the metal gate, for example, may be implemented to prevent polysilicon depletion effects, as known in the art. According to the presently embodied fabrication method, however, the dielectric capping and/or metal layers are purposefully removed, for example in step 220 of flowchart 200, prior to deposition of a polysilicon layer and formation of polysilicon gate 332 in step 240. Polysilicon gate 332 is then doped with LDD implants in step 250 to produce lightly doped polysilicon gate 342.

Consequently, the method embodied in flowchart 200 and structures 310 through 350 results in a gate stack in which polysilicon depletion can occur. That depletion of is lightly doped polysilicon gate 342 increases the effective gate oxide thickness of high-k gate dielectric 324, resulting in a device, such as MOSFET 100 in FIG. 1, operable under higher applied gate voltages. In effect, the present approach advantageously utilizes the depletion occurring at the interface of lightly doped polysilicon gate 142 and high-k gate dielectric 124 to produce voltage MOSFET 100.

Figure 4:
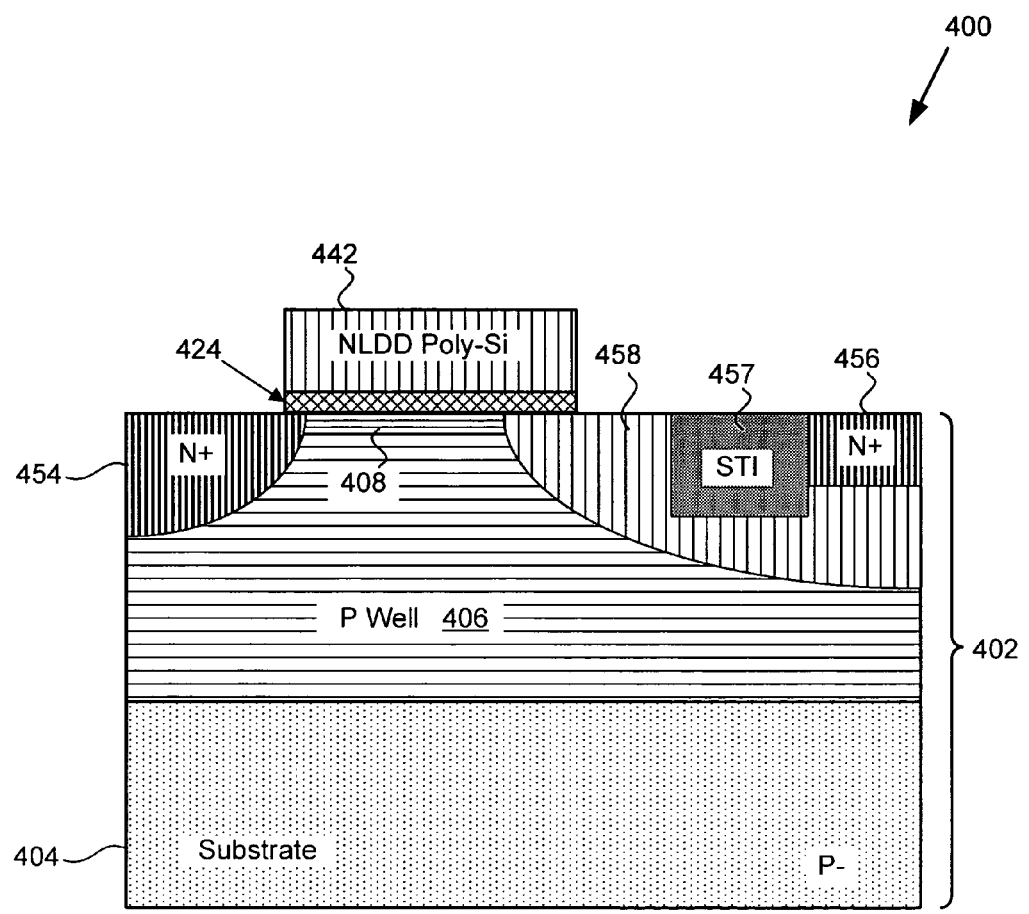
FIG. 4 shows a cross-sectional view of a structure representing a lateral diffused metal-oxide-semiconductor (LDMOS) device including a lightly doped semiconductor gate, according to one embodiment of the present invention.

FIG. 4 shows a cross-sectional view of a structure representing an LDMOS device including a lightly doped semiconductor gate, according to one embodiment of the present invention. LDMOS transistor 400 is formed in semiconductor body 402 including P type substrate 404, P well region 406, and P type channel implant 408. Semiconductor body 402, P type substrate 404, P well region 406, and P type channel implant 408 may be seen to correspond respectively to semiconductor body 102, P type substrate 104, P well region 106, and P type channel implant 108, in FIG. 1. In fact, in one embodiment, MOSFET 100 and LDMOS transistor 400 may be fabricated substantially concurrently on the same semiconductor wafer or die, for example. In addition, one or both of MOSFET 100 and LDMOS transistor 400 can be fabricated substantially concurrently with one or more high-k metal gate CMOS devices, using existing CMOS process flows. Consequently, one or both MOSFET 100 and LDMOS transistor 400 can be utilized in an IC including one or more high-k metal gate CMOS devices, such as logic devices, for example.

As shown in FIG. 4, LDMOS transistor 400, which is represented as an NMOS device, includes lightly doped polysilicon gate 442 formed on high-k gate dielectric 424, source 454, drain 456, shallow trench isolation (STI) structure 457 situated between is lightly doped polysilicon gate 442 and drain 456, and drain extension well 458. As known in the art, the combination of STI structure 457 and drain extension well 458 enable LDMOS transistor 400 to support a higher source-drain voltage than standard symmetrically arranged MOSFETs, such as MOSFET 100 in FIG. 1. In addition, implementation of lightly doped polysilicon gate 442 on high-k gate dielectric 424, and the depletion of lightly doped polysilicon gate 442 resulting from that arrangement, enhances the ability of LDMOS transistor 400 to withstand high operating voltages, such as voltages of approximately 3V to approximately 5V, for example.

The structures and methods disclosed in the present application enable several advantages over the conventional art. For example, by advantageously utilizing the effects of depletion at the interface of a lightly doped semiconductor gate and a high-k gate dielectric, embodiments of the present invention provide semiconductor devices configured to withstand higher operating voltages than would otherwise be the case. Moreover, the advantages associated with the present approach can be realized using existing high-k metal gate CMOS process flows, making integration of high voltage devices and CMOS core and IO devices on a common IC efficient and cost effective. As a result, the present approach improves design flexibility without adding cost or complexity to established semiconductor device fabrication processes.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A semiconductor device comprising:
a high-k gate dielectric overlying a well region having a first conductivity type formed in a semiconductor body;
a semiconductor gate formed on said high-k gate dielectric, said semiconductor gate being lightly doped over a channel so as to have a second conductivity type opposite said first conductivity type;
wherein depletion occurs at an interface between said high-k gate dielectric and said semiconductor gate.

2. The semiconductor device of claim 1, further comprising a channel implant of said first conductivity type under said semiconductor gate.

3. The semiconductor device of claim 1, wherein said semiconductor body is of said first conductivity type.

4. The semiconductor device of claim 1, wherein said semiconductor body is of said second conductivity type.

5. The semiconductor device of claim 1, wherein said semiconductor gate comprises polysilicon.

6. The semiconductor device of claim 1, wherein said semiconductor device comprises a metal-oxide-semiconductor field-effect transistor MOSFET.

7. The semiconductor device of claim 1, further comprising a non-conductive isolation region in said semiconductor body between said semiconductor gate and a highly doped drain region of said second conductivity type.

8. The semiconductor device of claim 7, further comprising at least one drain extension well of said second conductivity type surrounding said non-conductive isolation region in said semiconductor body.

9. The semiconductor device of claim 1, wherein said semiconductor device comprises an LDMOS transistor.

10. The semiconductor device of claim 1, wherein said semiconductor gate is doped by LDD implantation so as to be characterized by an LDD doping concentration.

11. An integrated circuit (IC) including a plurality of semiconductor devices, at least one of said plurality of semiconductor devices comprising:
   a high-k gate dielectric formed over a well region having a first conductivity type in a semiconductor body;
   a semiconductor gate formed on said high-k gate dielectric, said semiconductor gate being lightly doped over a channel so as to have a second conductivity type opposite said first conductivity type;
   wherein depletion occurs at an interface between said high-k gate dielectric and said semiconductor gate.

12. The IC of claim 11, wherein said plurality of semiconductor devices further comprises at least one CMOS logic device.

13. The IC of claim 11, wherein said semiconductor gate is doped by LDD implantation so as to be characterized by an LDD doping concentration.

14. A method for fabricating a semiconductor device, said method comprising:
   forming a semiconductor gate on a high-k gate dielectric formed over a well region of a first conductivity type in a semiconductor body;
   lightly doping said semiconductor gate over a channel, said semiconductor gate having a second conductivity type opposite said first conductivity type;
   wherein depletion occurs at an interface between said high-k gate dielectric and said semiconductor gate.

15. The method of claim 14, wherein lightly doping said semiconductor gate comprises using an LDD implantation process to dope said semiconductor gate.

16. The method of claim 14, further comprising:
   forming a metal layer over the high-k gate dielectric; and
   removing said metal layer before forming said semiconductor gate on said high-k gate dielectric.

17. The method of claim 14, wherein forming said semiconductor gate comprises forming a polysilicon gate.

18. The method of claim 14, wherein fabricating said semiconductor device comprises fabricating a metal-oxide-semiconductor field-effect transistor MOSFET.

19. The method of claim 14, wherein fabricating said semiconductor device comprises fabricating an LDMOS transistor.

20. The method of claim 14, wherein fabricating said semiconductor device is performed substantially concurrently with fabrication of at least one CMOS logic device.

\* \* \* \* \*